(12) United States Patent
Byun et al.

(10) Patent No.: US 7,483,320 B2
(45) Date of Patent: Jan. 27, 2009

(54) DATA INPUT/OUTPUT METHOD OF SEMICONDUCTOR MEMORY DEVICE AND SEMICONDUCTOR MEMORY DEVICE FOR THE SAME

(75) Inventors: Sang-Man Byun, Suwon-si (KR); Soo-In Cho, Seoul (KR); Sang-Seok Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 11/266,154

(22) Filed: Nov. 3, 2005

(65) Prior Publication Data

US 2006/0092723 A1    May 4, 2006

(30) Foreign Application Priority Data

Nov. 4, 2004    (KR) .................. 10-2004-0089221

(51) Int. Cl.
*G11C 7/00* (2006.01)
*G11C 29/00* (2006.01)
(52) U.S. Cl. .............. 365/201; 365/189.05; 365/189.03
(58) Field of Classification Search .............. 365/201, 365/189.05, 189.03
See application file for complete search history.

(56) References Cited

U.S. PATENT DOCUMENTS 6,038,182 A * 3/2000 Hwang ................. 365/201
6,430,094 B1   8/2002 Waller ................. 365/201
6,438,667 B1 * 8/2002 Shinozaki ............. 711/163
6,894,945 B2 * 5/2005 Sawada ............ 365/233.11
6,898,139 B2 * 5/2005 Lee et al. .............. 365/221
7,006,395 B2 * 2/2006 Ohno ................... 365/201

FOREIGN PATENT DOCUMENTS

KR    10-0265764    6/2000

* cited by examiner

*Primary Examiner*—Amir Zarabian
*Assistant Examiner*—Kretelia Graham
(74) *Attorney, Agent, or Firm*—Mills & Onello LLP

(57) ABSTRACT

In a method of inputting/outputting data in a semiconductor memory device, first data and second data are buffered and outputted to a first output node and a second output node, respectively, in a normal mode. In a test mode, the first data is buffered through a first transmission line and a second transmission line and outputted to the first output node and the second output node in response to at least one control signal. Also, in the test mode, the second data is buffered through the first transmission line and the second transmission line and outputted to the first output node and the second output node in response to the at least one control signal. Accordingly, test time may be reduced, and variations of operation characteristics caused by merging the data pins may also be reduced.

12 Claims, 8 Drawing Sheets

DATA INPUT/OUTPUT METHOD OF SEMICONDUCTOR MEMORY DEVICE AND SEMICONDUCTOR MEMORY DEVICE FOR THE SAME

CROSS-REFERENCE TO RELATED APPLICATIONS

This application relies for priority upon Korean Patent Application No. 2004-89221 filed on Nov. 4, 2004, the contents of which are herein incorporated by reference in its entirety.

BACKGROUND OF THE INVENTION

1. Field of the Invention

The present invention relates to a semiconductor memory device and a method of testing the same, and more particularly, to a semiconductor memory device capable of merging data pins and a method of testing the same.

2. Description of the Related Art

Semiconductor memory devices are tested after manufacturing the semiconductor memory devices, so as to find defects that may be generated while manufacturing the semiconductor memory device and so as to improve reliability of the semiconductor memory devices. Generally, a tester is used for performing a plurality of test procedures. The tester may be electrically connected to the semiconductor memory device through a plurality of data pins.

When the data pins of the semiconductor memory device are merged, a single tester can be connected to more semiconductor memory devices. That is, more semiconductor memory devices can be tested simultaneously. Therefore, less time is required for testing the semiconductor memory devices, the expanse of carrying out the test is reduced and productivity of the semiconductor memory device is improved.

Conventionally, where at least two of the data pins of the semiconductor memory device are merged for testing the semiconductor memory device, the two data pins are electrically connected at the exterior of the semiconductor package and a data output buffer inside the semiconductor package determines to which data pin data is output.

For example, if an 'X8' memory device having eight data pins is tested based on the conventional method of merging the data pins, a data pin DQ0 and a data pin DQ4 are merged, a data pin DQ1 and a data pin DQ5 are merged, a data pin DQ2 and a data pin DQ6 are merged, and a data pin DQ3 and a data pin DQ7 are merged. After merging the data pins, a data output buffer in the semiconductor package outputs one of either data outputting to the data pin DQ0 or data outputting to the data pin DQ4, one of either data outputting to the data pin DQ1 or data outputting to the data pin DQ5, one of either data outputting to the data pin DQ2 or data outputting to the data pin DQ6, and one of either data outputting to the data pin DQ3 or data outputting to the data pin DQ7, for testing the semiconductor memory device. Accordingly, the number of data pins to be connected to the tester is reduced according to the conventional method of merging the data pins.

FIG. 1 is a block diagram showing a prior art approach for merging data pins of the semiconductor memory device.

An X8 semiconductor memory device having 8 data pins is shown in FIG. 1 as an example. The X8 semiconductor memory device is only illustrated as having four D0 pins (DQ0, DQ1, DQ4, DQ5) and relevant portions thereof and the remaining portions are omitted for the sake of clarity.

Referring to FIG. 1, the conventional semiconductor memory device 100 includes a memory cell array 110, an input/output (I/O) MUX 120, an I/O sense amp (S/A) 130, a DBMUX 140, a data output buffer 150 and data output pins DQ0, DQ1, DQ4 and DQ5. The DBMUX 140 may not be included in the conventional semiconductor memory device depending on the type of semiconductor memory device.

The memory cell array 110 includes a plurality of cells for storing data D0, D1, D4 and D5.

The I/O MUX 120 and the I/O S/A 130 are used to transmit data from the memory cell array 110 and amplify the data.

The DBMUX 140 multiplexes data to output the multiplexed data to a target data output pin.

The data output buffer 150 buffers data and outputs the buffered data to data output pins DQ0, DQ1, DQ4 and DQ5.

In order to reduce the number of data pins, the data output pins DQ0 and DQ4 are electrically connected to each other at an outside of the semiconductor memory device. Further, the data output pins DQ1 and DQ5 are electrically connected to each other at the outside of the conventional semiconductor memory device. When a test is performed on the conventional semiconductor memory device, the tester is electrically connected to one of data output pins DQ0 and DQ4 instead of both of data output pins DQ0 and DQ4. Further, the tester is connected to one of data output pins DQ1 and DQ5 instead of both of data output pins DQ1 and DQ5.

The data output buffer 150 outputs data D0 to the data output pin DQ0 and outputs data D1 to the data output pin DQ1 when a control signal RDM0 is activated. In this circumstance, the control signal RDM1 is inactivated to control the data output buffer 150 so as not to output data D4 to the data output pin DQ4 and so as not to output data D5 to the data output pin DQ5. Accordingly, the data D0 is output to the data output pin DQ0, and the data D1 is output to the data output pin DQ1. Since the data output pin DQ0 is electrically connected to the data output pin DQ4, the data D0 may be also output to the data output pin DQ4. Further, since the data output pin DQ1 is electrically connected to the data output pin DQ5, the data D1 may be also output to the data output pin DQ5.

The data output buffer 150 outputs data D4 to the data output pin DQ4 and outputs data D5 to the data output pin DQ5 when a control signal RDM1 is activated. In this circumstance, the control signal RDM0 is inactivated to control the data output buffer 150 so as not to output data D0 to the data output pin DQ0 and so as not to output data D1 to the data output pin DQ1. Accordingly, the data D4 is output to the data output pin DQ4, and the data D5 is output to the data output pin DQ5. Since the data output pin DQ4 is electrically connected to the data output pin DQ0, the data D4 may be also output to the data output pin DQ0. Since the data output pin DQ5 is electrically connected to the data output pin DQ1, the data D5 may be also output to the data output pin DQ1.

That is, if the tester is connected to one of two data output pins DQ0 and DQ4, the tester can read two data D0 and D4 according to the control signals RDM0 and RDM1. Further, if the tester is connected to one of two data output pins DQ1 and DQ5, the tester can read two data D1 and D5 according to the control signals RDM0 and RDM1.

As described above, the conventional semiconductor memory device in FIG. 1 can output two data bits to a single data output pin according to a control signal. Therefore, wiring between the tester and the conventional semiconductor memory device may be reduced.

FIG. 2 is a block diagram illustrating a method of testing a semiconductor memory device using a prior art approach for merging data pins.

An 8 X device is shown in FIG. 2 as an example of the semiconductor memory device.

Referring to FIG. 2, every two of data output pins DQ0, DQ1, DQ2, DQ3, DQ4, DQ5, DQ6 and DQ7 of the semiconductor memory device are electrically connected. That is, the data output pin DQ0 is electrically connected to the data output pin DQ4, the data output pin DQ1 is electrically connected to the data output pin DQ5, the data output pin DQ2 is electrically connected to the data output pin DQ6, and the data output pin DQ3 is electrically connected to the data output pin DQ7.

The four pairs of data output pins are connected to the tester 210 without connecting the tester 210 to all of the data output pins of the semiconductor memory device. That is, the tester 210 is connected to a pair of the data output pins DQ0 and DQ4, a pair of the data output pins DQ1 and DQ5, a pair of the data output pins DQ2 and DQ6, and a pair of the data output pins DQ3 and DQ7. Accordingly, the tester 210 can be connected to more semiconductor memory devices to enable testing multiple semiconductor memory devices at once.

However, the conventional method of merging data pins of a semiconductor memory device causes a problem such that it is sometimes difficult to correlate operation characteristics of a semiconductor memory device in a test mode to operation characteristics of a semiconductor memory device in a normal mode. That is, it is difficult to ensure that the operation characteristics of the semiconductor memory device in the normal mode are fully reflected by the operation characteristics of the semiconductor memory device obtained from the test.

Since two data output pins are electrically connected at the outside of a package according to the conventional method of merging data pins, it is equivalent to the data output buffer providing a single buffered signal to two data pins. Accordingly, various I/O related parameters may be influenced during the test mode. For example, a load on the data pin may be increased during the test to affect the I/O related parameters. Therefore, a result of the test may show operation characteristics different from the operation characteristics of the semiconductor memory device in the normal mode. Such a problem becomes more serious in a high-speed memory device.

SUMMARY OF THE INVENTION

Accordingly, the present invention is provided to substantially obviate one or more problems due to limitations and disadvantages of the related art.

The present invention provides a data input/output method for internally merging a plurality of data of a semiconductor memory device.

Moreover, the present invention provides a semiconductor memory device that internally merges a plurality of data.

Further, the present invention provides a data pin merging method for internally merging a plurality of data of a semiconductor device.

Moreover, the present invention provides a data pin merging circuit for internally merging a plurality of data of a semiconductor memory device.

According to one aspect, the invention is directed to a method of inputting/outputting data in a semiconductor memory device, comprising: buffering, in a normal mode, first data and second data that are read from a memory cell array to generate buffered first data and buffered second data and to output the buffered first data and the buffered second data to a first output node and a second output node, respectively; and buffering, in a test mode, one of the first data and the second data through a first transmission line and a second transmission line in response to at least one control signal to generate one of buffered first data and buffered second data and to output the one of buffered first data and buffered second data to the first output node and the second output node.

In one embodiment, the at least one control signal is provided from an external device. In one embodiment, the semiconductor memory device is a double-data rate DRAM (DDR DRAM) and the at least one control signal is applied through a Data Input Output Mask (DQM) pin from the external device.

In one embodiment, in the normal mode, the first data are transmitted through the first transmission line and the second data are transmitted through the second transmission line, the first and second transmission lines being electrically disconnected from each other. In one embodiment, in the test mode, the one of the first data and the second data are transmitted through the first transmission line and the second transmission line in response to the at least one control signal, the first transmission line and the second transmission line being electrically connected to each other.

In the test mode, the first data may be output to the first output node by buffering the first data, and the second data may be output to a first output node by buffering the second data. When the first data is output to the first output node in the test mode, the second data may be output to a second output node.

According to another aspect, the invention is directed to a semiconductor memory device comprising: first and second output nodes to which data signals are outputted; a memory cell array including a plurality of cells for storing a plurality of data; and a data output circuit configured to read first data and second data from the memory cell array to output the data signals to the first output node and the second output node. In a normal mode, the data output circuit buffers the first data and the second data to output the buffered first data and the buffered second data to the first node and the second node, respectively. In a test mode, the data output circuit, in response to at least one control signal, buffers one of the first data and the second data through the first transmission line and the second transmission line to generate one of buffered first data and buffered second data and outputs the one of the buffered first data and the buffered second data to the first output node and the second output node.

In one embodiment, the at least one control signal is provided from an external device. In one embodiment, the semiconductor memory device is a double-data rate DRAM (DDR DRAM) and the at least one control signal is applied through a Data Input Output Mask (DQM) pin from the external device.

In one embodiment, the data output circuit includes: a multiplexer unit configured, in the normal mode, to output the first data and the second data through the first transmission line and the second transmission line, respectively, and configured, in the test mode, to output one of the first data and the second data through the first transmission line and the second transmission line in response to the at least one control signal; and an output buffer unit configured to buffer data signals inputted through the first transmission line and the second transmission line to generate buffered data signals and to output the buffered data signals to the first output node and the second output node.

In one embodiment, the multiplexer unit includes: a first switch configured to electrically couple the first data to the first transmission line; a second switch configured to electrically couple the second data to the second transmission line; and a third switch configured to electrically couple the first transmission line to the second transmission line. In one embodiment, in the normal mode, the first switch and the second switch are closed and the third switch is opened. In one embodiment, in the test mode, the first switch and the third switch are closed and the second switch is opened, or the second switch and the third switch are closed and the first switch is opened.

According to another aspect, the invention is directed to a method of inputting/outputting data in a semiconductor memory device, the method comprising: reading first data and second data from a memory cell array; and outputting one of the first data and the second data to a first output node and a second output node by buffering the one of the first data and the second data through a first transmission line and a second transmission line in response to at least one control signal.

In one embodiment, the at least one control signal is provided from an external device. In one embodiment, the semiconductor memory device is a double-data rate DRAM (DDR DRAM), and the at least one control signal is applied through a Data Input Output Mask (DQM) pin from the external device.

In one embodiment, the outputting of data to the first output node and the second output node includes transmitting the first data to the first transmission line in response to the at least one control signal while the first transmission line is electrically connected to the second transmission line, or transmitting the second data to the second transmission line in response to the at least one control signal while the first transmission line is electrically connected to the second transmission line.

According to another aspect, the invention is directed to a data output buffer of a semiconductor memory device, the data output buffer comprising: a multiplexer unit configured to output one of first data and second data read from a memory cell array through a first transmission line and a second transmission line in response to at least one control signal; and an output buffer unit configured to buffer one of the first data and the second data inputted through the first transmission line and the second transmission line to generate buffered data and to output the buffered data to a first output node and a second output node.

In one embodiment, the at least one control signal is provided from an external device. In one embodiment, the semiconductor memory device is a double-data rate DRAM (DDR DRAM), and the at least one control signal is applied through a Data Input Output Mask (DQM) pin from the external device.

In one embodiment, the multiplexer unit includes: a first switch configured to electrically couple the first data to the first transmission line; a second switch configured to electrically couple the second data to the second transmission line; and a third switch configured to electrically couple the first transmission line to the second transmission line. In one embodiment, the first switch and the third switch of the multiplexer unit are closed and the second switch is opened, or the second switch and the third switch are closed and the first switch is opened.

According to another aspect, the invention is directed to a data input/output method of a semiconductor memory device, the method comprising: outputting, in a normal mode, first data and second data read from a memory cell array to a first output node and a second output node, respectively, by buffering the first data and the second data; and outputting, in a test mode, one of the first data and the second data to the first and second output nodes by buffering one of the first data and the second data in response to at least one control signal applied from an external device.

In the data input/output method and the semiconductor memory device of the invention, the test mode indicates an operation mode performing a test of a semiconductor memory device connected to a tester. In the test mode, a plurality of data is output to a single data output pin according to at least one control signal.

The data output buffer in a semiconductor memory device and the method of inputting/outputting data of the semiconductor memory device may be used not only for a test of the semiconductor memory device but also for all applications having constraints in the number of pins.

The data output buffer and the method of inputting/outputting data of the semiconductor memory device may be applied to merge not only two of data pins but also more than three of data pins.

The semiconductor memory device may be a DDR RAM.

Accordingly, a correlation between operation characteristics of a semiconductor memory device in a normal mode and operation characteristics of a semiconductor memory device in a test mode may be improved by merging a plurality of data at an inside of the semiconductor memory device.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EXAMPLE EMBODIMENTS

Hereinafter, the embodiments of the present invention will be described in detail with reference to the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

Figure 3:
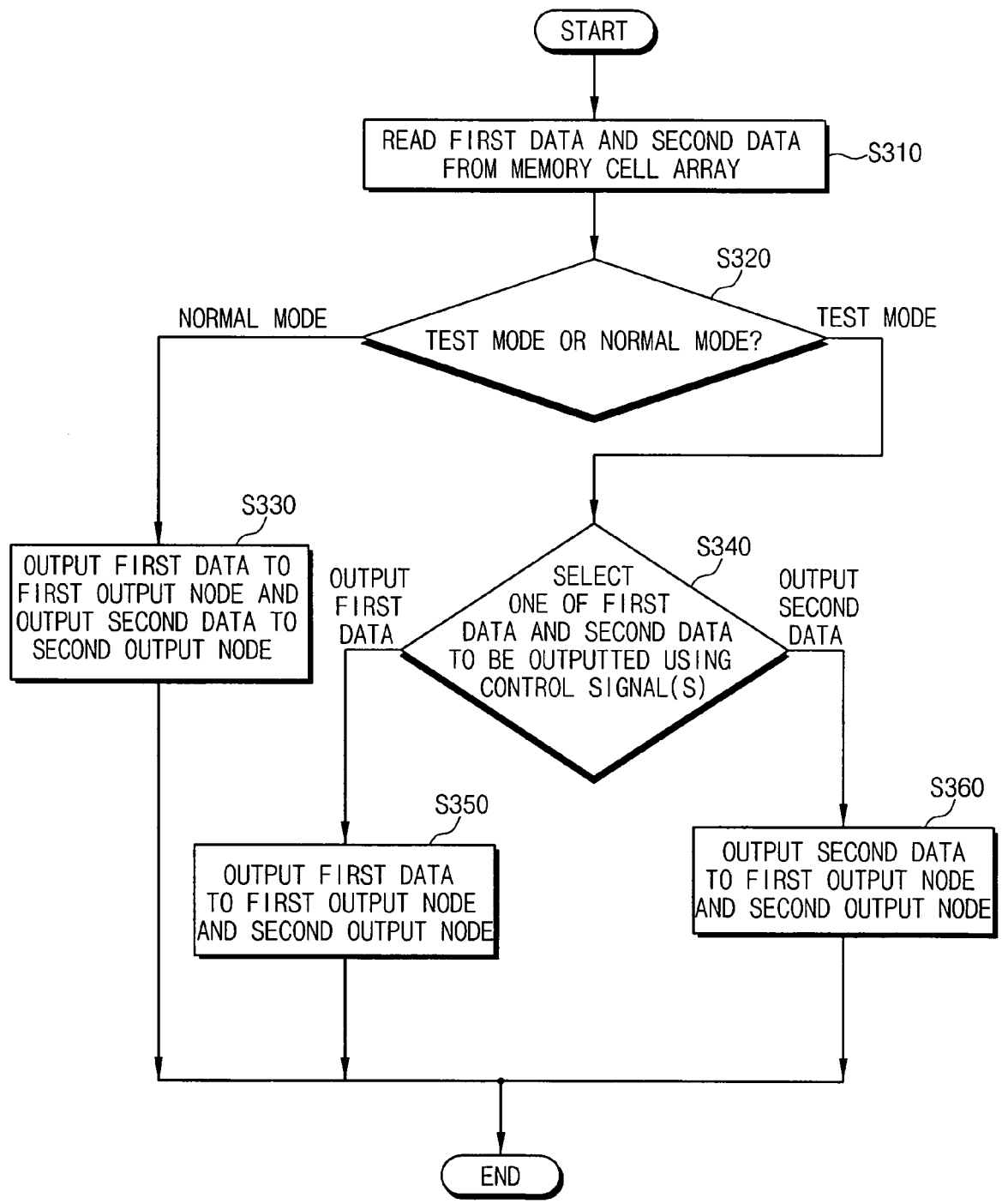
FIG. 3 is a flowchart illustrating a data input/output method of a semiconductor memory device according to an embodiment of the present invention.

FIG. 3 is a flowchart illustrating a data input/output method of a semiconductor memory device according to an embodiment of the present invention.

Referring to FIG. 3, in the data input/output method according to an example embodiment, first data and second data are read from a memory cell array in step S310.

The first data and the second data may be provided through an I/O MUX and an I/O S/A.

Further, whether a semiconductor memory device is operated in a normal mode or a test mode is determined in step S320.

The test mode is an operation mode for performing a test of a semiconductor memory device connected to a tester. In the test mode, a plurality of data may be output to a single data output pin based on a control signal.

When the semiconductor memory device is operated in the normal mode, the first data and the second data are buffered and output to a first output node and a second output node, respectively, in step S330.

When the semiconductor memory device is operated in a test mode, whether the first data is outputted or the second data is outputted is determined using a control signal in step S340.

The control signal may be applied from an external device, or a DQM (Input Mask & Output Enable) pin may be used to apply the control signal. The external device denotes a device providing the control signal, which is arranged at an outside of the semiconductor memory device. The control signal may be a signal of a plurality of bits. The DQM pin may be provided as two DQM pins including an upper DQM pin and a lower DQM pin.

When the semiconductor memory device is controlled by the control signal to output the first data, the first data is buffered through two transmission lines and the buffered first data are outputted to a first output node and a second output node in step S350.

The buffering through two transmission lines does not imply that the first data is buffered and outputted to two output nodes. Instead, the buffering through two transmission lines denotes that two first data signals are generated before the buffering operation and each of the two first data signals is separately buffered through a corresponding transmission line.

When the semiconductor memory device is controlled by the control signal to output the second data, the second data is buffered through two transmission lines and the buffered second data are outputted to the first output node and the second output node in step S360.

The buffering through two transmission lines does not imply that the second data is buffered and outputted to two output nodes. Instead, the buffering through two transmission lines denotes that two second data signals are generated before the buffering operation and each of the two second data signals is separately buffered through a corresponding transmission line.

Accordingly, operation characteristics of the semiconductor memory device in the normal mode may be well reflected by operation characteristics in the test mode in the data input/output method according to the present example embodiment.

The steps shown in FIG. 3 may not be performed in the order exactly as shown in FIG. 3. That is, any order in the figure is for illustrative purposes only and is not meant to imply a required order. For example, the step S310 may be performed immediately before the step S330 or the step S350 may be performed immediately before the step S360.

Figure 4A:
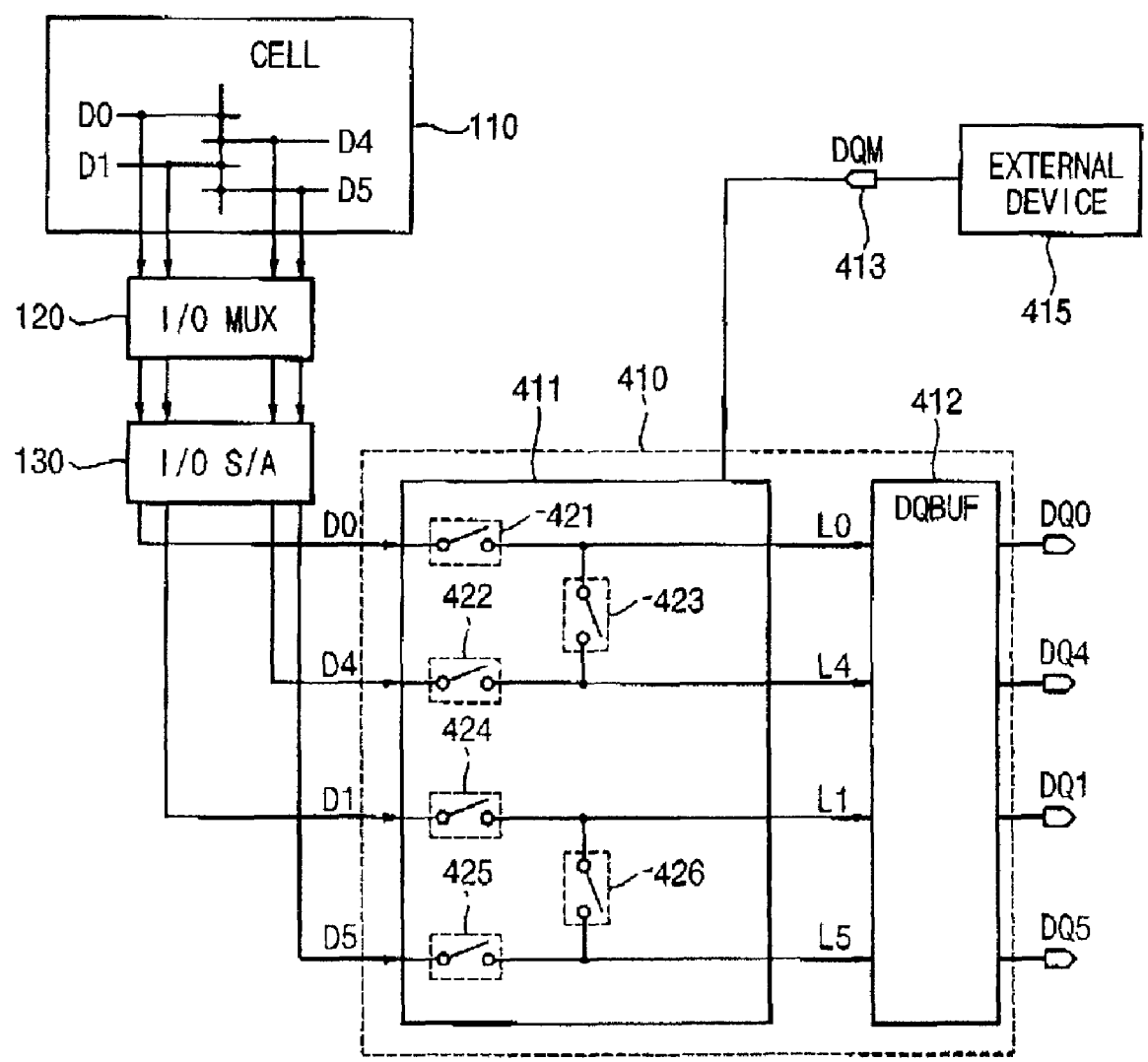
FIGS. 4A and 4B are block diagrams illustrating a semiconductor memory device according to an embodiment of the present invention.
Figure 4B:
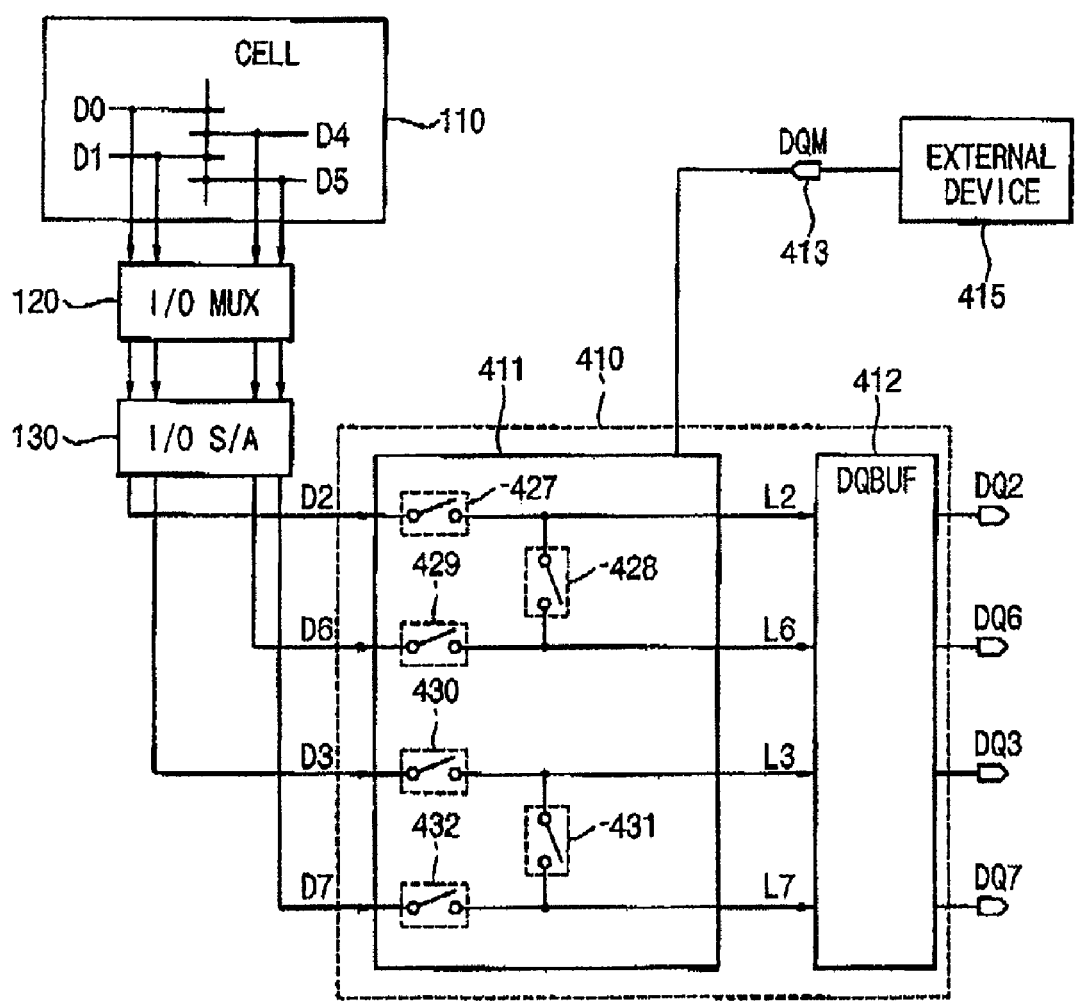

FIGS. 4A and 4B are block diagrams illustrating a semiconductor memory device according to an example embodiment of the present invention.

An X8 device having 8 DQ pins is shown in FIGS. 4A and 4B as an example of a semiconductor memory device. The X8 semiconductor memory device is only illustrated as having four DQ pins (DQ0, DQ1, DQ4, DQ5) in FIG. 4A and DQ2, DQ3, DQ6 and DQ7) and relevant portions thereof and the remaining portions are omitted for the sake of clarity.

Referring to FIGS. 4A and 4B, the semiconductor memory device according to an example embodiment includes a memory cell array 110, an input/output (I/O) MUX 120, an I/O sense amp (S/A) 130, a data output circuit 410, and data output pins DQ0, DQ1, DQ4 and DQ5, in FIG. 4A and data output pins DQ2, DQ3, DQ6 and DQ7, in FIG. 4B.

The memory cell array 110 includes a plurality of cells for storing data D0, D1, D4 and D5.

The I/O MUX 120 and the I/O S/A 130 are used to transmit and amplify data stored in the memory cell array 110.

Figure 1:
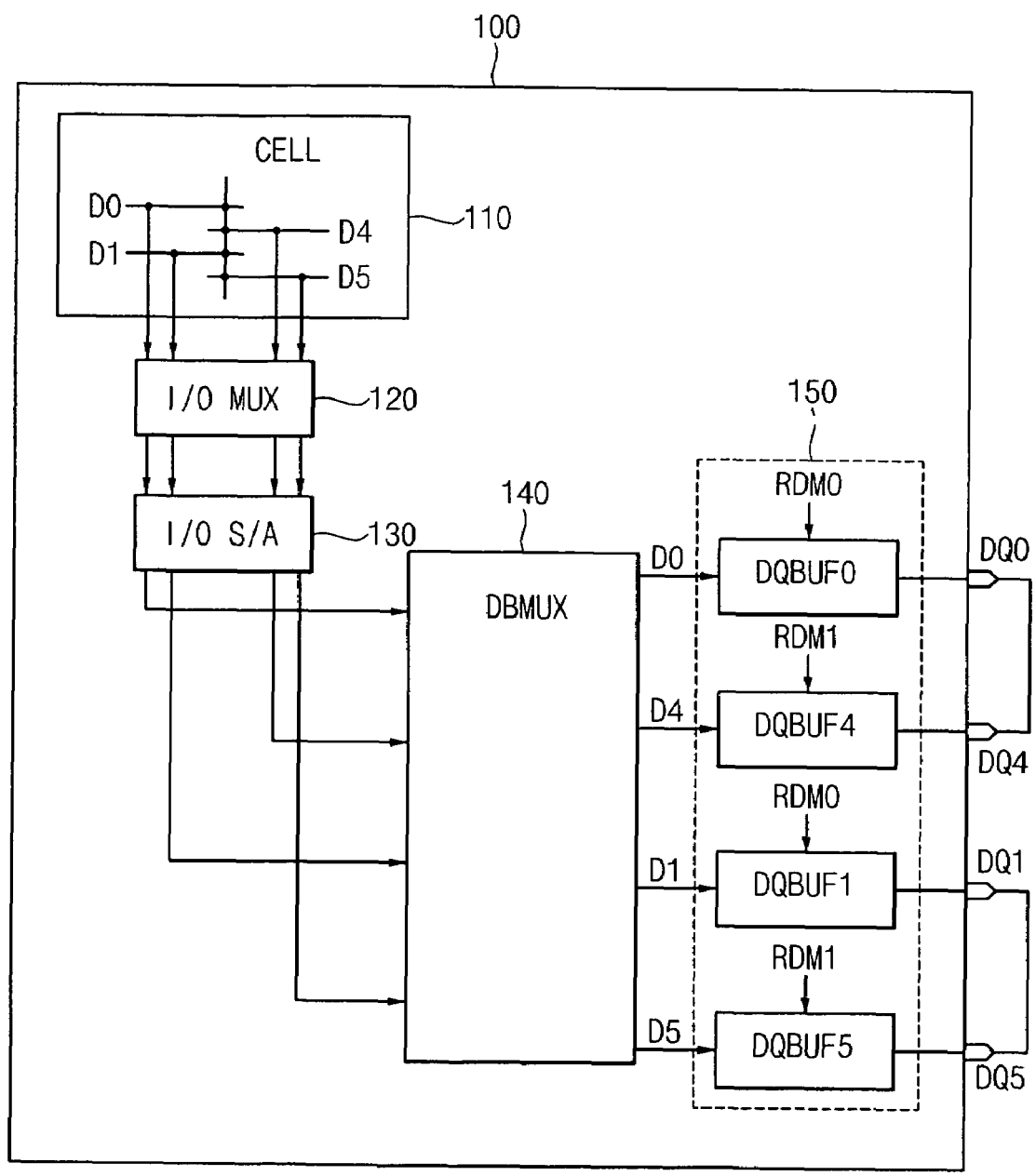
FIG. 1 is a block diagram showing a prior art approach for merging data pins of a semiconductor memory device.
Figure 2:
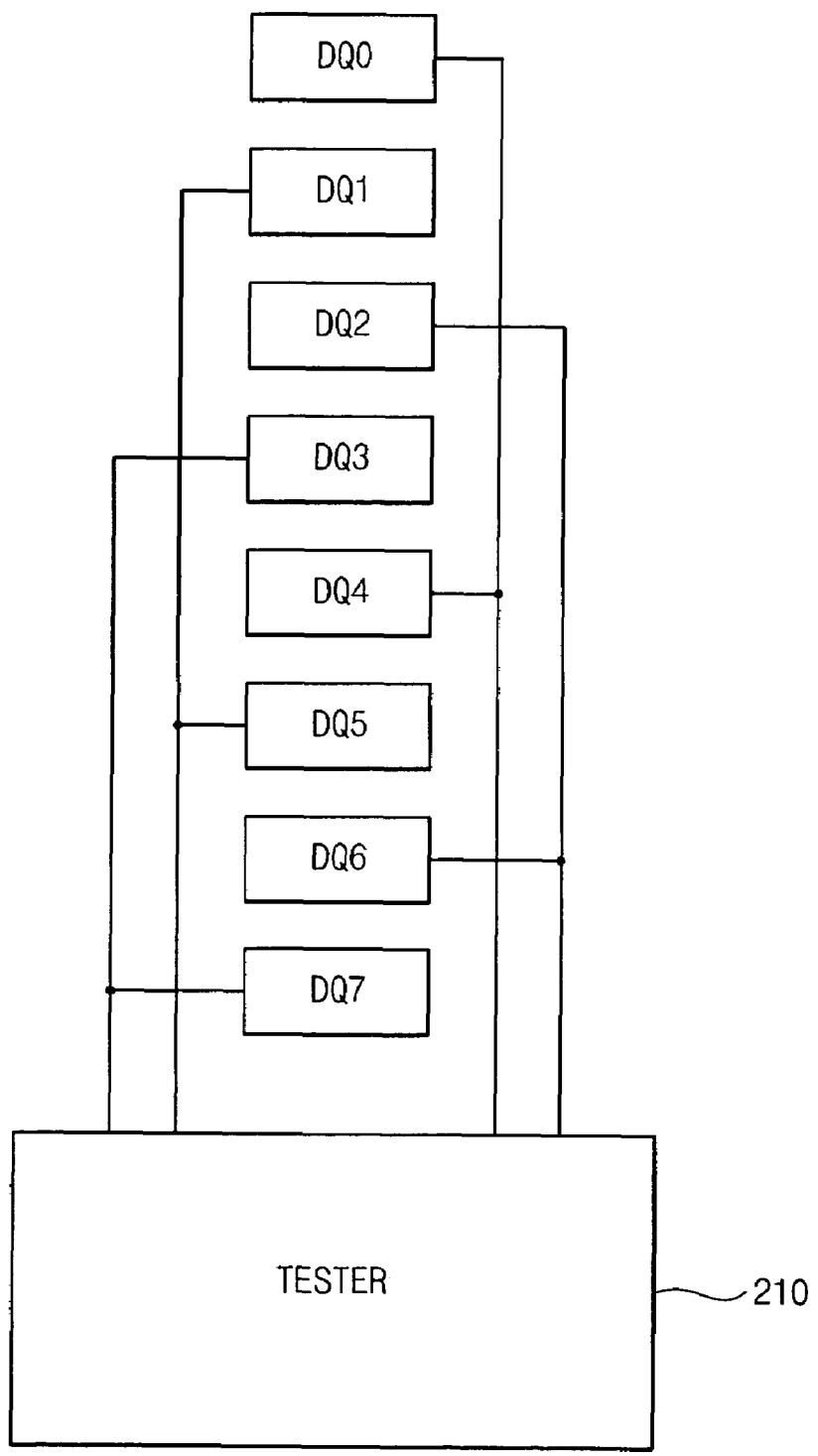
FIG. 2 is a block diagram illustrating a method of testing a semiconductor memory device using a prior art approach for merging data pins.

The memory cell array 110, the I/O MUX 120 and the I/O S/A 130 may be similar in form and function to the elements designated by the same numerals in FIG. 1.

The data output circuit 410 includes a MUX (multiplexer) unit 411 and an output buffer unit DQBUF 412.

The MUX unit 411 outputs data D0, D1, D4 and D5 through transmission lines L0, L1, L4 and L5, respectively, in the normal mode.

In addition, in the test mode, the MUX unit 411 may output data D0 through transmission lines L0 and L4 and may output data D1 through transmission lines L1 and L5 based on the control signal. Also, the MUX unit 411 may output data D4 through transmission lines L0 and L4 and may output data D5 through transmission lines L1 and L5 based on the control signal.

The control signal may be externally applied to the MUX unit 411 through a DQM (Input Mask & Output Enable) pin 413. That is, the control signal is provided from an external device 415, which is arranged at an outside of the semiconductor memory device. The control signal is a signal of a plurality of bits. The DQM pin may be provided as two DQM pins, i.e., an upper DQM pin and a lower DQM pin.

The MUX unit 411 may be embodied as a DBMUX.

The MUX unit 411 includes six switches 421 to 426.

In the normal mode, the switches 421, 422, 424 and 425 are closed, and the switches 423 and 426 are opened. The term 'closed switch' denotes short circuiting of two terminals, and the term 'opened switch' denotes open-circuiting of two terminals. Accordingly, in the normal mode, the data D0, D1, D4 and D5 are output through each of the transmission lines L0, L1, L4 and L5, respectively.

In the test mode, the switches 421, 423, 424 and 426 are closed, and the switches 422 and 425 are opened based on the control signal. Accordingly, the data D0 is outputted through the transmission lines L0 and L4, and the data D1 is outputted through the transmission lines L1 and L5. Alternatively, the switches 422, 423, 425 and 426 are closed, and the switches 421 and 424 are opened based on the control signal. Accordingly, the data D4 is outputted through the transmission lines L0 and L4, and the data D5 is outputted through the transmission lines L1 and L5.

The output buffer unit DQBUF 412 buffers data signals transmitted through the transmission lines L0, L1, L4 and L5, and outputs the buffered data signals to output nodes DQ0, DQ1, DQ4 and DQ5.

The output buffer unit 412 may be embodied using a typical data output buffer. Compared with the data output buffer 150 shown in FIG. 1, the output buffer unit 412 does not need to determine whether data is output to the output pin or not by using a control signal (e.g., RDM0 in FIG. 1). Instead, the output buffer unit 412 merely buffers data signals inputted through the transmission lines L0, L1, L4 and L5 and outputs the buffered data signals to the output nodes DQ0, DQ1, DQ4 and DQ5. Therefore, the output buffer unit DQBUF 412 may be readily embodied compared to the data output buffer 150 shown in FIG. 1.

TABLE 1

| Operation | | Closed Switches | Opened Switches |
|---|---|---|---|
| Normal Mode | D0 → L0 | 421, 422, | 423, 426 |
| | D1 → L1 | 424, 425 | |
| | D4 → L4 | | |
| | D5 → L5 | | |
| Test Mode First Mode | D0 → L0, L4 | 421, 423, | 422, 425 |
| | D1 → L1, L5 | 424, 426 | |
| Second Mode | D4 → L0, L4 | 422, 423, | 421, 424 |
| | D5 → L1, L5 | 425, 426 | |

Table 1 shows an operation of the MUX unit shown in FIG. 4A.

Like text and numeral references in Table 1 denote like elements in FIG. 4A.

Referring to Table 1 and FIG. 4A, in the normal mode, the MUX unit 411 outputs data D0, D1, D4 and D5 through transmission lines L0, L1, L4 and L5, respectively. Namely, the switches 421, 422, 424 and 425 are closed and the switches 423 and 426 are opened.

In the test mode, the switches 421, 423, 424 and 426 of the MUX unit 411 are closed and the switches 422 and 425 are opened based on the control signal corresponding to a first mode. In this case, the data D0 is output through the transmission lines L0 and L4 and the data D1 is output through the transmission lines L1 and L5.

Alternatively, the switches 422, 423, 425 and 426 of the MUX unit 411 are closed, and the switches 421 and 424 are opened based on the control signal corresponding to a second mode. In this case, the data D4 is output through the transmission lines L0 and L4, and the data D5 is output through the transmission lines L1 and L5.

Figure 5:
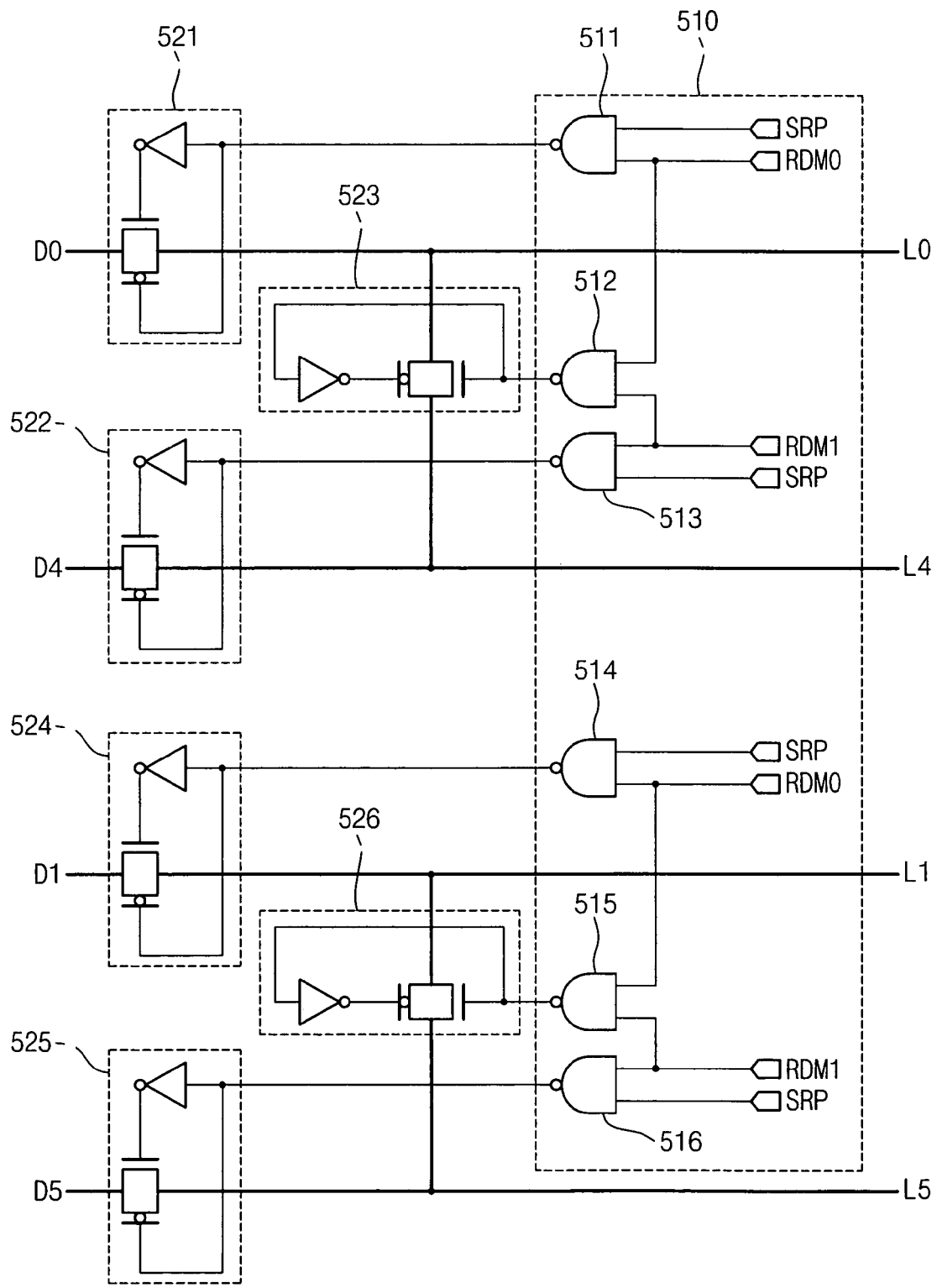
FIG. 5 is a circuit diagram illustrating a MUX unit shown in FIGS. 4A and 4B according to an embodiment of the present invention.

FIG. 5 is a circuit diagram illustrating the MUX unit 411 shown in FIG. 4A according to an example embodiment of the present invention.

Referring to FIG. 5, the MUX unit 411 includes six switches 521 to 526 and a switching signal generating unit 510.

The switches 521 to 526 may perform similar functions to the switches 421 to 426 shown in FIG. 4A and 427-432 shown in FIG. 4B. The switches 521 to 526 shown in FIG. 5 may be embodied using CMOS transmission gates. The CMOS transmission gate is used to electrically short or open terminals according to an input switching signal.

The switching signal generating unit 510 generates the switching signal to control the switches 521 to 526. A second read pulse signal (SRP) shown in FIG. 5 is for sampling data with an appropriate timing. In the example embodiment of FIG. 5, it is assumed that the second read pulse signal (SRP) is applied only as logic 1.

The switching signal generating unit 510 includes six NAND gates 511 to 516.

At first, when both a first control signal RDM0 and a second control signal RDM1 have logic 0, all of the NAND gates 511 to 516 output logic 1. Accordingly, the switches 521, 522, 524 and 525 are opened, and the switches 523 and 526 are closed. In this case, none of data D0, D1, D4 and D5 are transmitted to the transmission lines L0, L1, L4 and L5.

When the first control signal RDM0 has logic 1 and the second control signal RDM1 has logic 0, the NAND gates 511 and 514 output logic 0 and the NAND gates 512, 513, 515 and 516 output logic 1. Accordingly, the switches 521, 523, 524 and 526 are closed, and the switches 522 and 525 are opened. In this case, the data D0 is transmitted to the transmission lines L0 and L4, and the data D1 is transmitted to the transmission lines L1 and L5.

When the first control signal RDM0 has logic 0 and the second control signal RDM1 has logic 1, the NAND gates 513 and 516 output logic 0 and the NAND gates 511, 512, 514 and 515 output logic 1. Accordingly, the switches 522, 523, 525 and 526 are closed, and the switches 521 and 524 are opened. In this case, the data D4 is transmitted to the transmission lines L0 and L4, and the data D5 is transmitted to the transmission lines L1 and L5.

When both the first control signal RDM0 and the second control signal RDM1 have logic 1, all of the NAND gates output logic 0. Accordingly, the switches 521, 522, 524 and 525 are closed, and the switches 523 and 526 are opened. In this case, the data D0, D1, D4 and D5 are transmitted to the transmission lines L0, L1, L4 and L5.

The first control signal RDM0 and the second control signal RDM1 may be externally applied, and the DQM (Input Mask & Output Enable) pin may be used to apply the first and the second control signal (RDM0, RDM1). That is, the first and the second control signal (RDM0, RDM1) are applied from an external device arranged at an outside of the semiconductor memory device. In addition, the DQM pin may be provided as two DQM pins, such as an upper DQM pin and a lower DQM pin.

TABLE 2

| RDM1 | RDM0 | Operation |
|---|---|---|
| 0 | 0 | Not used |
| 0 | 1 | D0 → L0, L4 |
| | | D1 → L1, L5 |
| 1 | 0 | D4 → L0, L4 |
| | | D5 → L1, L5 |
| 1 | 1 | D0 → L0 |
| | | D1 → L1 |
| | | D4 → L4 |
| | | D5 → L5 |

Table 2 summarizes an operation of the MUX unit based on the control signals RSM0 and RDM1 in FIG. 5.

As described above, the data input/output method of a semiconductor memory device and the semiconductor memory device according to the example embodiments shown in FIGS. 3 to 5 does not require any electrical connection of the data output pins at an outside of the semiconductor memory device in order to reduce the number of pins during the test. A tester is not connected to all of the data output pins of the semiconductor memory device but connected to one of respective pair of data output pins, which are internally connected to each other. In this manner, the tester may read two data according to a control signal.

Figure 6:
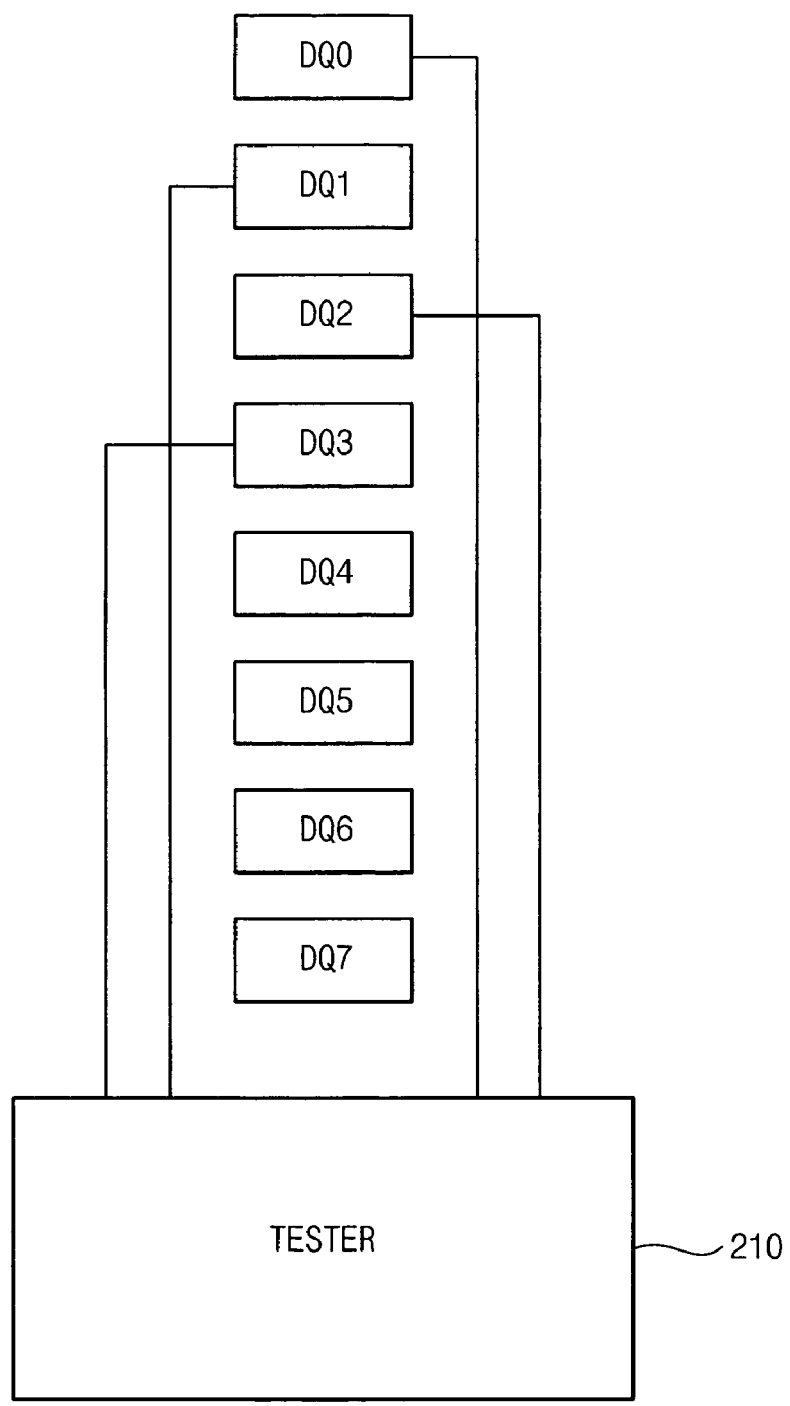
FIG. 6 is a block diagram illustrating a method of testing a semiconductor memory device according to an embodiment of the present invention.

FIG. 6 is a block diagram showing a tester connected to a semiconductor memory device to perform testing of the semiconductor memory device using a pin merging method according to an example embodiment of the present invention.

In FIG. 6, an X8 device is tested as an example of a semiconductor memory device.

Referring to FIG. 6, the semiconductor memory device includes data output pins DQ0, DQ1, DQ2, DQ3, DQ4, DQ5, DQ6 and DQ7, and each pair of the data output pins may be electrically connected to each other at an inside of the semiconductor memory device. For example, as illustrated in FIGS. 4A and 4B the data output pin DQ0 may be electrically connected to the data output pin DQ4, the data output pin DQ1 may be electrically connected to the data output pin DQ5, the data output pin DQ2 may be electrically connected to the data output pin DQ6, and the data output pin DQ3 may be electrically connected to the data output pin DQ7.

The tester 210 is connected to four pairs of data output pins of the semiconductor memory device instead of connecting to all of 8 data output pins DQ0 to DQ7. Namely, the tester 210 may be connected to one of the data output pins DQ0 and DQ4, one of the data output pins DQ1 and DQ5, one of the data output pins DQ2 and DQ6, and one of the data output pins DQ3 and DQ7. Therefore, more semiconductor memory devices to be tested may be coupled to the tester without requiring additional wiring.

The example embodiments described with reference to FIGS. 3 to 6 are discussed regarding reduction of interface pins for testing the semiconductor memory device, however, example embodiments of the present invention are not limited to the test. Namely, example embodiments of the present invention may be applied to all applications with constraints in the number of pins.

Figure 7:
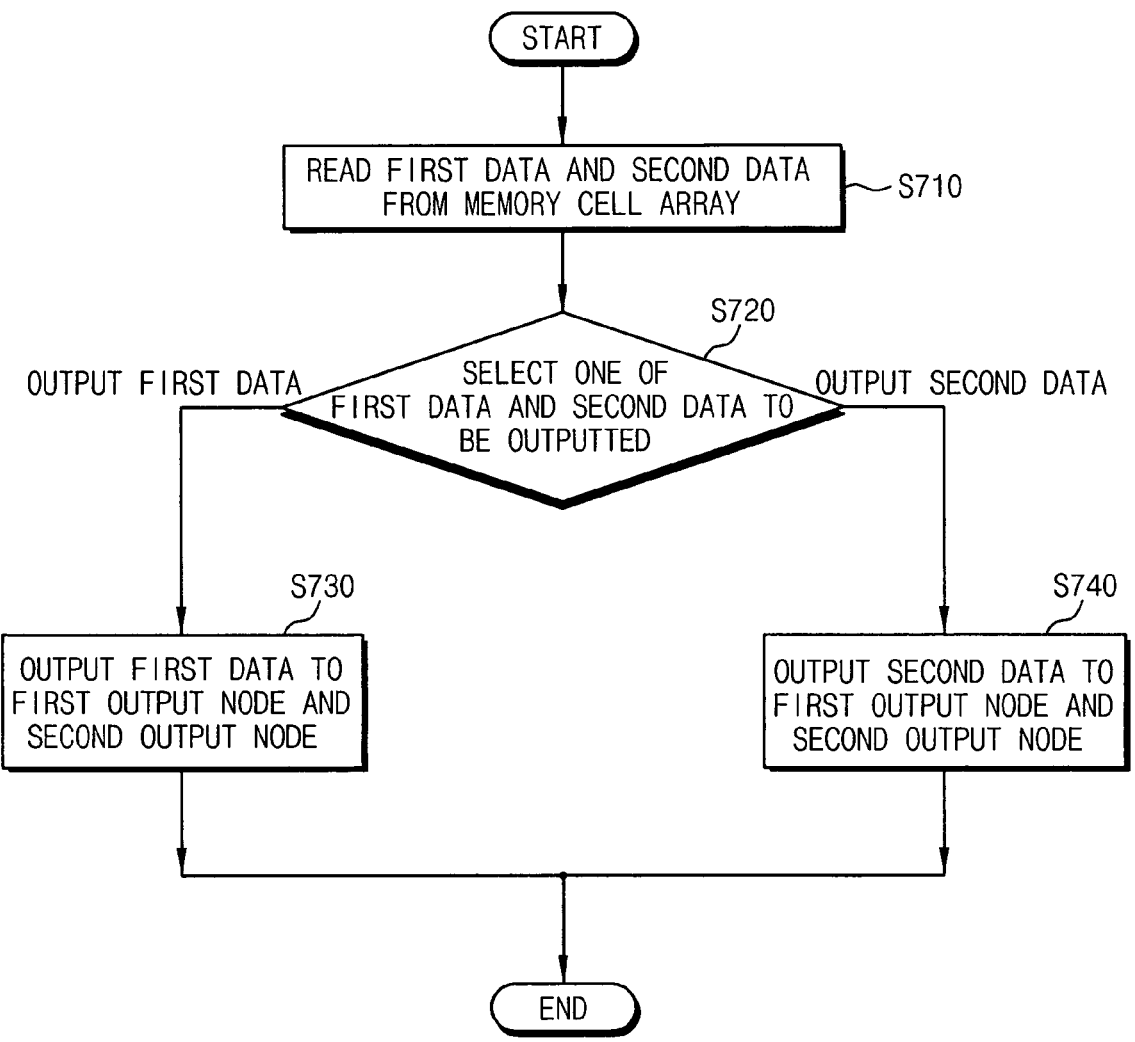
FIG. 7 is a flowchart illustrating a method of merging data pins according to an embodiment of the present invention.

FIG. 7 is a flowchart illustrating a method of merging data pins according to an example embodiment of the present invention.

Referring to FIG. 7, first data and second data are read from a memory cell array in step S710.

The first data and the second data may be provided through an I/O MUX and an I/O S/A.

Further, which one of the first data and the second data are outputted is determined using a control signal in step S720.

The control signal may be applied from an external device, and a DQM (Input Mask & Output Enable) pin may be used for applying the control signal. The term "external device" may denote a device arranged at an outside of the semiconductor memory device. Further, the control signal may be a signal of a plurality of bits, and the DQM pin may be provided as two DQM pins, such as an upper DQM pin and a lower DQM pin.

When the first data is determined to be outputted based on the control signal, the first data is buffered through two transmission lines and outputted to a first output node and a second output node in step S730.

The buffering through two transmission, lines does not imply that the first data is buffered and outputted to two output nodes. Instead, two first data signals are generated before the buffering and each of the two first data signals is separately buffered through a corresponding transmission line.

When the second data is determined to be outputted based on the control signal, the second data is buffered through two transmission lines and the buffered second data are outputted to the first output node and the second output node in step S740.

The buffering through two transmission lines does not imply that the second data is buffered and outputted to two output nodes. Instead, two second data signals are generated before the buffering and each of the two second data signals is separately buffered through a corresponding transmission line.

Accordingly, variations of operation characteristics in the test mode may be reduced despite the fact that the data pins are merged at an inside of the semiconductor memory device.

The steps shown in FIG. 7 may be performed according to an order shown in FIG. 7, a reverse order or simultaneously. In addition, any order in FIG. 7 is not meant to imply a required order.

The method of merging data pins at an inside of a semiconductor memory device according to the example embodiment shown in FIG. 7 may be embodied using a data pin merging circuit of the semiconductor memory device. For example, the data pin merging circuit of the semiconductor memory device may be embodied using the data output circuit as shown in FIGS. 4 and 5.

As described above, data pins may be merged at an inside of the semiconductor memory device according to the example embodiments of the present invention. In addition, data may be read from the semiconductor memory device through merged data pins according to a data input/output method according to the present invention. Therefore, a number of interface pins connected to a tester may be reduced. In addition, output pins do not need to be electrically connected at an outside of the semiconductor memory device. Accordingly, less time may be required for testing, a cost of testing may be reduced, and the productivity of the semiconductor memory device may be improved.

Further, since the data pins are merged at the inside of the semiconductor memory device according to the example embodiment of the present invention, variations of parameters related to input/output data such as an increase in pin load may be reduced. Therefore, the test of the semiconductor memory device using the data input merging method is effectively performed according to the present invention.

While the present invention has been described with respect to the particular embodiments, it will be apparent to those skilled in the art that various changes and modifications may be made without departing from the spirit and scope of the invention as defined in the following claims.

What is claimed is:

1. A method of inputting/outputting data in a semiconductor memory device, comprising:

buffering, in a normal mode, first data and second data that are read from a memory cell array to generate buffered first data and buffered second data and to output the buffered first data and the buffered second data to a first output node of the memory device and a second output node of the memory device, respectively; and buffering, in a test mode, one of the first data and the second data through a first transmission line and a second transmission line in response to at least one control signal to generate one of buffered first data and buffered second data and to output the one of buffered first data and buffered second data to the first output node of the memory device and the second output node of the memory device, wherein the at least one control signal is provided from an external device, and wherein the semiconductor memory device is a double-data rate DRAM (DDR DRAM) and the at least one control signal is applied through a Data Input Output Mask (DQM) pin from the external device.

2. The method of claim 1, wherein, in the normal mode, the first data are transmitted through the first transmission line and the second data are transmitted through the second transmission line, the first and second transmission lines being electrically disconnected from each other.

3. The method of claim 2, wherein, in the test mode, the one of the first data and the second data are transmitted through the first transmission line and the second transmission line in response to the at least one control signal, the first transmission line and the second transmission line being electrically connected to each other.

4. A semiconductor memory device comprising:
   first and second output nodes of the memory device to which data signals are outputted;
   a memory cell array including a plurality of cells for storing a plurality of data; and
   a data output circuit configured to read first data and second data from the memory cell array to output the data signals to the first output node of the memory device and the second output node of the memory device,
   wherein, in a normal mode, the data output circuit buffers the first data and the second data read from the memory cell array to output buffered first data and buffered second data to the first output node and the second output node, respectively, and
   in a test mode, the data output circuit, in response to at least one control signal, outputs one of the first data and the second data read from the memory cell array through a first transmission line and a second transmission line to generate one of buffered first data and buffered second data and outputs the one of the buffered first data and the buffered second data to the first output node of the memory device and the second output node of the memory device,
   wherein the data output circuit includes:
   a multiplexer unit configured, in the normal mode, to output the first data and the second data read from the memory cell array through the first transmission line and the second transmission line, respectively, and configured, in the test mode, to output one of the first data and the second data read from the memory cell array through the first transmission line and the second transmission line in response to the at least one control signal; and
   an output buffer unit configured, in the normal mode, to buffer the first data and the second data inputted through the first transmission line and the second transmission line to generate the buffered first data and the buffered second data and to output the buffered first data and the buffered second data to the first output node and the second output node, and in the test mode, to buffer the one of the first data and the second data inputted through the first transmission line and the second transmission line to generate the one of the buffered first data and the buffered second data and to output the one of the buffered first data and the buffered second data to the first output node and the second output node.

5. The semiconductor memory device of claim 4, wherein the at least one control signal is provided from an external device.

6. The semiconductor memory device of claim 5, wherein the semiconductor memory device is a double-data rate DRAM (DDR DRAM) and the at least one control signal is applied through a Data Input Output Mask (DQM) pin from the external device.

7. The semiconductor memory device of claim 4, wherein the multiplexer unit includes:
   a first switch configured to electrically couple the first data to the first transmission line;
   a second switch configured to electrically couple the second data to the second transmission line; and
   a third switch configured to electrically couple the first transmission line to the second transmission line.

8. The semiconductor memory device of claim 7, wherein, in the normal mode, the first switch and the second switch are closed and the third switch is opened.

9. The semiconductor memory device of claim 8, wherein, in the test mode, the first switch and the third switch are closed and the second switch is opened, or the second switch and the third switch are closed and the first switch is opened.

10. A method of inputting/outputting data in a semiconductor memory device, the method comprising:
    reading first data and second data from a memory cell array in a normal mode; and
    outputting, in a test mode, one of the first data and the second data to a first output node of the memory device and a second output node of the memory device by buffering the one of the first data and the second data through a first transmission line and a second transmission line in response to at least one control signal,
    wherein the at least one control signal is provided from an external device, and
    wherein the semiconductor memory device is a double-data rate DRAM (DDR DRAM), and the at least one control signal is applied through a Data Input Output Mask (DQM) pin from the external device.

11. The method of claim 10, wherein the outputting of data to the first output node and the second output node includes transmitting the first data to the first transmission line in response to the at least one control signal while the first transmission line is electrically connected to the second transmission line, or transmitting the second data to the second transmission line in response to the at least one control signal while the first transmission line is electrically connected to the second transmission line.

12. A data input/output method of a semiconductor memory device, the method comprising:
    outputting, in a normal mode, first data and second data read from a memory cell array to a first output node of the memory device and a second output node of the memory device, respectively, by buffering the first data and the second data; and
    outputting, in a test mode, one of the first data and the second data read from the memory cell array to the first and second output nodes of the memory device by buffering the one of the first data and the second data read from the memory array in response to at least one control signal applied from an external device,
    wherein the semiconductor memory device is a double-data rate DRAM (DDR DRAM), and the at least one control signal is applied through a Data Input Output Mask (DQM) pin from the external device.

* * * * *

UNITED STATES PATENT AND TRADEMARK OFFICE
CERTIFICATE OF CORRECTION

PATENT NO. : 7,483,320 B2  Page 1 of 1
APPLICATION NO. : 11/266154
DATED : January 27, 2009
INVENTOR(S) : Byun et al.

It is certified that error appears in the above-identified patent and that said Letters Patent is hereby corrected as shown below:

Column 8, line 7 delete ")" after "DQ5"

Column 8, line 14 insert --,-- after "FIG. 4A"

Signed and Sealed this

Fifth Day of May, 2009

JOHN DOLL
*Acting Director of the United States Patent and Trademark Office*